(12) United States Patent
Zhang et al.

(10) Patent No.: US 11,880,530 B2
(45) Date of Patent: Jan. 23, 2024

(54) CHIP-ON-FILM, DISPLAY SUBSTRATE, DISPLAY DEVICE, AND DRIVING METHOD

(71) Applicants: Beijing BOE Display Technology Co., Ltd., Beijing (CN); BOE Technology Group Co., Ltd., Beijing (CN)

(72) Inventors: Yinlong Zhang, Beijing (CN); Shulin Yao, Beijing (CN); Wenpeng Ma, Beijing (CN); Pengfei Hu, Beijing (CN); Qi Li, Beijing (CN); Zhihua Sun, Beijing (CN); Yanping Liao, Beijing (CN); Xibin Shao, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/801,728

(22) PCT Filed: Oct. 22, 2021

(86) PCT No.: PCT/CN2021/125806
§ 371 (c)(1),
(2) Date: Aug. 23, 2022

(87) PCT Pub. No.: WO2022/100415
PCT Pub. Date: May 19, 2022

(65) Prior Publication Data
US 2023/0086825 A1 Mar. 23, 2023

(30) Foreign Application Priority Data
Nov. 10, 2020 (CN) .......................... 202011247780.1

(51) Int. Cl.
*G06F 3/041* (2006.01)
*G09G 3/20* (2006.01)
*G11C 19/28* (2006.01)

(52) U.S. Cl.
CPC ....... *G06F 3/04166* (2019.05); *G09G 3/2096* (2013.01); *G11C 19/28* (2013.01); *G09G 2310/0286* (2013.01); *G09G 2310/08* (2013.01)

(58) Field of Classification Search
CPC .............. G06F 3/04166; G09G 3/2096; G09G 2310/0286; G09G 2310/08; G11C 19/28
See application file for complete search history.

(56) References Cited

U.S. PATENT DOCUMENTS

2009/0251404 A1 10/2009 Hwang et al.
2010/0328198 A1 12/2010 Tsubata
(Continued)

FOREIGN PATENT DOCUMENTS

CN 101551566 A 10/2009
CN 101960371 A 1/2011
(Continued)

OTHER PUBLICATIONS

PCT/CN2021/125806 international search report and written opinion.
CN202011247780.1 first office action.

*Primary Examiner* — Towfiq Elahi
(74) *Attorney, Agent, or Firm* — IPro, PLLC

(57) ABSTRACT

The present disclosure provides a chip-on-film, a display substrate, a display device and a driving method. The display substrate includes a plurality of scanning lines and a plurality of cascaded shift register units coupled to the scanning lines. The display substrate further includes an output control signal line electrically coupled to each shift register unit for providing an enable signal for the shift register unit. The (Continued)

output control signal lines include at least two output control signal lines for providing different enable signals, and two adjacent cascaded shift register units are coupled to different output control signal lines.

14 Claims, 5 Drawing Sheets

(56) References Cited

U.S. PATENT DOCUMENTS

| | | |
|---|---|---|
| 2012/0146964 A1 | 6/2012 | Kim |
| 2013/0271689 A1 | 10/2013 | Kim et al. |
| 2015/0187297 A1* | 7/2015 | Park .................... G09G 5/18 |
| | | 345/99 |
| 2015/0236047 A1* | 8/2015 | Kim .................... H01L 27/124 |
| | | 438/30 |
| 2017/0017324 A1 | 1/2017 | O'Keeffe |
| 2017/0102801 A1 | 4/2017 | Ko et al. |
| 2017/0235405 A1 | 8/2017 | Wang et al. |
| 2018/0335884 A1 | 11/2018 | Zhang |
| 2020/0341573 A1 | 10/2020 | Yang |
| 2021/0174718 A1 | 6/2021 | Li et al. |

FOREIGN PATENT DOCUMENTS

| | | |
|---|---|---|
| CN | 102543017 A | 7/2012 |
| CN | 103376942 A | 10/2013 |
| CN | 104681000 A | 6/2015 |
| CN | 104751812 A | 7/2015 |
| CN | 104991678 A | 10/2015 |
| CN | 106406612 A | 2/2017 |
| CN | 106814910 A | 6/2017 |
| CN | 107992229 A | 5/2018 |
| CN | 108806571 A | 11/2018 |
| CN | 109188749 A | 1/2019 |
| CN | 109411005 A | 3/2019 |
| CN | 211293912 U | 8/2020 |
| KR | 20040062206 A | 7/2004 |
| TW | 201714055 | 4/2017 |
| WO | 2018233296 A1 | 12/2018 |

* cited by examiner

CHIP-ON-FILM, DISPLAY SUBSTRATE, DISPLAY DEVICE, AND DRIVING METHOD

CROSS-REFERENCE TO RELATED APPLICATIONS

This application is the U.S. national phase of PCT Application No. PCT/CN2021/125806 filed on Oct. 22, 2021, which claims a priority of the Chinese Patent Application No. 202011247780.1 filed on Nov. 10, 2020, the entire contents of which are hereby incorporated by reference.

TECHNICAL FIELD

The present disclosure relates to the field of display technology, in particular to a chip-on-film, a display substrate, a display device and a driving method thereof.

BACKGROUND

In order to achieve a good touch effect, a Full-In-Cell (FIC) touch display panel generally performs touch detection in a Long Horizontal Blank (LHB) manner, i.e., an image is divided into at least two parts, and the touch detection is performed between the parts of the image. During the touch detection, the scanning of a displayed image is stationary, so a display effect may be adversely affected.

SUMMARY

An object of the present disclosure is to provide a chip-on-film, a display substrate, a display device, and a driving method thereof, so as to prevent the display effect from being adversely affected during the touch detection.

In a first aspect, the present disclosure provides in some embodiments a chip-on-film, including a plurality of shift register units cascaded to each other. Each shift register unit is coupled to a scanning line of a display substrate, the chip-on-film further includes an output control signal line for providing an enable signal for the shift register unit, and two adjacent and cascaded shift register units are coupled to different output control signal lines.

In a possible embodiment of the present disclosure, a control circuitry corresponding to each shift register unit includes a level switch, a gate circuitry and a boosting module, the shift register unit and the output control signal line are both coupled to a control end of the gate circuitry, the boosting module is arranged at an output end of the gate circuitry, and the level switch is arranged between the shift register unit and the control end of the gate circuitry, or the level switch is arranged between the output end of the gate circuitry and the boosting module.

In a possible embodiment of the present disclosure, each output control signal line includes two output connection ends connected in parallel to each other.

In a possible embodiment of the present disclosure, the different output control signal lines are electrically coupled to different signal control ends, and the enable signals provided by the different output control signal lines are at a high level at at least a part of time points.

In a second aspect, the present disclosure provides in some embodiments a display substrate, including a plurality of scanning lines and a plurality of shift register units coupled to the scanning lines and cascaded to each other. The display substrate further includes output control signal lines electrically coupled to the shift register units for providing enable signals for the shift register units, the output control signal lines include at least two output control signal lines for providing different enable signals, and two adjacent and cascaded shift register units are coupled to different output control signal lines.

In a possible embodiment of the present disclosure, at least two output control signal lines are electrically coupled to different signal control ends, and the enable signals provided by the at least two output control signal lines are at a high level at at least a part of time points.

In a possible embodiment of the present disclosure, the output control signal lines include a first output control signal line and a second output control signal line, the first output control signal line is coupled to the shift register units corresponding to odd-numbered scanning lines, and the second output control signal line is coupled to the shift register units corresponding to even-numbered scanning lines.

In a possible embodiment of the present disclosure, the output control signal lines are divided into at least two groups, each group of output control signal lines include at least one first output control signal line and at least one second output control signal line, the shift register units corresponding to the scanning lines are arranged at both sides of the display substrate along an extension direction of the scanning lines, and each shift register unit is coupled to at least one group of output control signal lines.

In a possible embodiment of the present disclosure, the output control signal lines are divided into at least two groups, each group of output control signal lines include at least one first output control signal line and at least one second output control signal line, the shift register units corresponding to the scanning lines are arranged at one side of the display substrate along an extension direction of the scanning line, and the two groups of output control signal lines are coupled to the shift register unit at two ends along a direction in which the scanning lines are arranged, respectively.

In a possible embodiment of the present disclosure, the display substrate further includes a circuit board for transmitting a data signal and a gate connection driving line, and the output control signal line passes through regions corresponding to the circuit board and the gate connection driving line sequentially along a direction from the circuit board to the shift register unit.

In a possible embodiment of the present disclosure, the display substrate further includes: a base substrate; a plurality of data signal lines on the base substrate, an orthogonal projection of each data signal line onto the base substrate crossing an orthogonal projection of each scanning line onto the base substrate; a plurality of touch sensing blocks arranged on the base substrate and spaced apart from each other, each touch sensing block including a plurality of touch electrodes electrically coupled to each other and spaced apart from each other; and a plurality of touch signal lines arranged on the base substrate, at least a part of the touch signal lines being electrically coupled to the plurality of touch sensing blocks respectively.

In a possible embodiment of the present disclosure, the plurality of touch signal lines extends along an extension direction of the plurality of data signal lines, the plurality of touch signal lines is divided into a plurality of touch signal line groups, each touch signal line group includes adjacent touch signal lines, orthogonal projections of the touch signal lines in a same touch signal line group onto the base substrate are located at two sides of an orthogonal projection of a same data signal line onto the base substrate, the orthogonal projections of the adjacent touch signal lines and the orthogonal projection of the same data signal line each includes a portion located between orthogonal projections of the adjacent touch electrodes onto the base substrate, and a layer where the adjacent touch signal lines are located is different from a layer where the data signal line is located.

In a possible embodiment of the present disclosure, each touch signal line includes a plurality of body portions and a plurality of curved portions, the body portions and the curved portions are arranged alternately, an orthogonal projection of each body portion onto the base substrate is located between the orthogonal projections of the adjacent touch electrodes onto the base substrate, the display substrate further includes a plurality of switching elements on the base substrate, and each switching element is located between one curved portion and the data signal line.

In a third aspect, the present disclosure provides in some embodiments a display device including the above-mentioned display substrate.

In a possible embodiment of the present disclosure, the display device further includes a timing controller, and the output control signal line is electrically coupled to a signal control end of the timing controller to obtain the enable signal.

In a fourth aspect, the present disclosure provides in some embodiments a driving method for the above-mentioned display device, including: enabling at least one of a first enable signal and a second enable signal to be at a low level at a display stage; and maintaining the first enable signal and the second enable signal at a high level at a touch stage.

In a possible embodiment of the present disclosure, the maintaining the first enable signal and the second enable signal at a high level at the touch stage includes, in the case that a gate ON signal corresponding to an $N^{th}$ scanning line is maintained at a high level, maintaining the first enable signal at a high level at a next rising edge of the first enable signal so as to control an output channel of the $N^{th}$ scanning line to be at a low level, and maintaining the second enable signal at a high level at a next rising edge of the second enable signal so as to control an output channel of an $(N-1)^{th}$ scanning line to be at a low level. When the first enable signal and the second enable signal are maintained at a high level, the display device enters the touch stage, N is an integer greater than 1, the first enable signal and the second enable signal are enable signals provided by different output control signal lines, and shift register units corresponding to the $N^{th}$ scanning line and the $(N-1)^{th}$ scanning line are two adjacent shift register units in a plurality of shift register units cascaded to each other.

In a possible embodiment of the present disclosure, a rising edge where the gate ON signal corresponding to the $N^{th}$ scanning line is maintained at a high level corresponds to a previous high level of the first enable signal, a falling edge where the first enable signal is maintained at a high level corresponds to a high level of the gate ON signal corresponding to an $(N+2)^{th}$ scanning line, and a falling edge where the second enable signal is maintained at a high level corresponds to a high level of the gate ON signal corresponding to the $(N+1)^{th}$ scanning line.

In a possible embodiment of the present disclosure, a duration within which the first enable signal and the second enable signal are maintained at a high level is the same as a duration within which the gate ON signal is maintained at a high level.

In a possible embodiment of the present disclosure, a rising edge where the gate ON signal corresponding to the $N^{th}$ scanning line is maintained at a high level corresponds to a previous falling edge of the first enable signal, a falling edge where the first enable signal is maintained at a high level corresponds to a rising edge of the gate ON signal corresponding to the $(N+2)^{th}$ scanning line, and a falling edge where the second enable signal is maintained at a high level corresponds to a rising edge of the gate ON signal corresponding to the $(N+1)^{th}$ scanning line.

According to the embodiments of the present disclosure, different enable signals are provided through the plurality of control signal lines, and during the touch detection, the output channels of the scanning lines are controlled through different enable signals. As a result, it is able to ensure an accurate output waveform of the scanning line without adversely affecting the scanning, thereby to improve the display quality.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The present disclosure provides in some embodiments a display substrate.

Figure 1A:
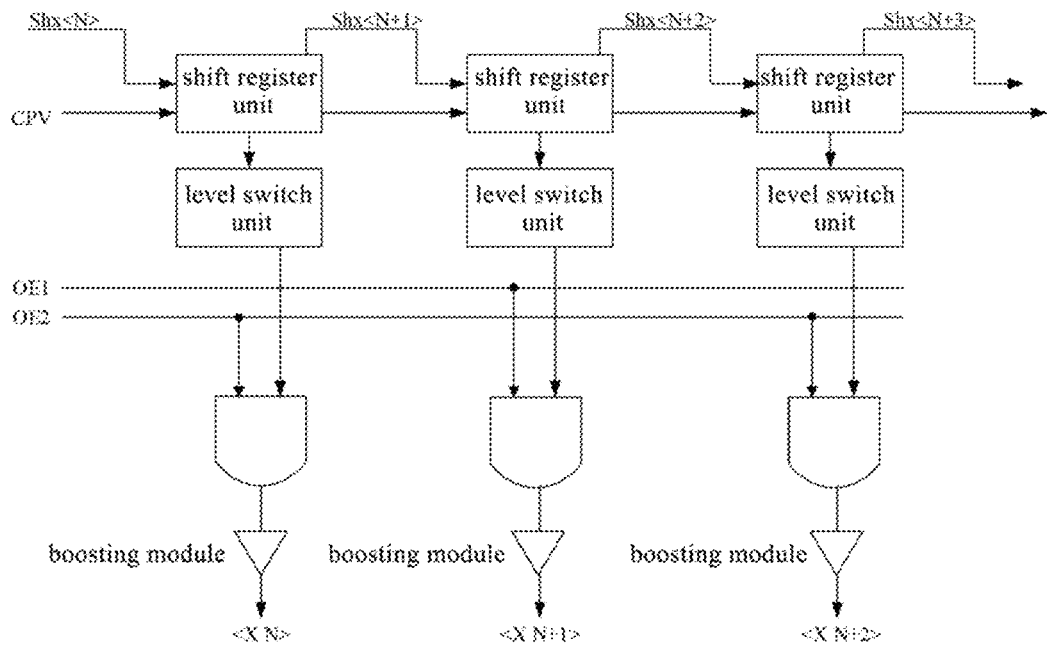
FIG. 1A is a circuit diagram of a shift register unit in a display substrate according to one embodiment of the present disclosure.
Figure 1B:
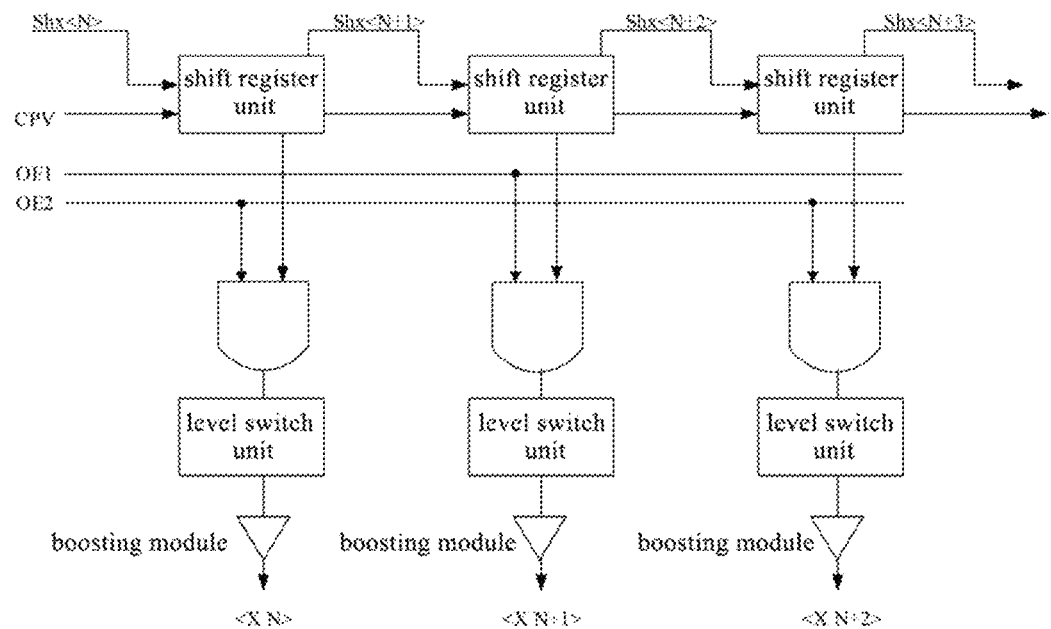
FIG. 1B is another circuit diagram of the shift register unit in the display substrate according to one embodiment of the present disclosure.

As shown in FIGS. 1A and 1B, in the embodiments of the present disclosure, the display substrate includes a plurality of scanning lines and a plurality of shift register units cascaded to each other and each coupled to a scanning line. The display substrate further includes output control signal lines each electrically coupled to the shift register unit to provide an enable signal for the shift register unit. The output control signal lines include at least two output control signal lines for providing different enable signals. In the plurality of cascaded shift register units, two adjacent shift register units are coupled to different output control signal lines, so that different output control signals are provided to the two adjacent and cascaded shift register units.

As shown in FIGS. 1A and 1B, in the embodiments of the present disclosure, a gate driving circuitry includes a plurality of shift register units. During the operation, the shift register unit generates a control signal under the control of a gate ON signal CPV (also referred to as a front-end clock signal) and a start signal STV, and the generated control signal is outputted through a channel under the control of an AND gate circuitry including an enable signal and an internal shift data signal Shx<N>, and then the outputted signal is switched by a level switch and amplified by a boosting module to obtain a desired channel signal <X N>.

As shown in FIG. 1A, in the embodiments of the present disclosure, the level switch is arranged between the shift register unit and the AND gate circuitry, and as shown in FIG. 1B, the level switch is also arranged between the AND gate circuitry and the boosting module, which will not be particularly defined herein.

In the embodiments of the present disclosure, a touch module is an in cell touch module, and a common electrode of a display panel also serves as a touch electrode of the touch module, so as to save a space occupied by the touch module and reduce a thickness of the display panel.

In the embodiments of the present disclosure, a plurality of output control signal lines is configured to provide different enable signals to the two adjacent shift register units, so as to individually control the application of a control voltage to each scanning line. During the touch detection, an output channel of each scanning line is controlled through different enable signaling, so as to ensure an accurate output waveform of the scanning line without adversely affecting the scanning, thereby to improve the display quality.

The present disclosure further provides in some embodiments a chip-on-film (or chip on flex, COF).

In the embodiments of the present disclosure, the COF includes a plurality of shift register units cascaded to each other, and each shift register unit is coupled to a scanning line of a display substrate. The COF further includes an output control signal line for providing an enable signal for the shift register unit, and two adjacent and cascaded shift register units are coupled to different output control signal lines.

It should be appreciated that, for a large-size display device, the shift register units are actually arranged in a chip of the COF, while for a small-size display device, the shift register units are directly arranged on the display substrate. Hence, in the embodiments of the present disclosure, the display substrate includes or does not include the COF.

In some embodiments of the present disclosure, each scanning line corresponds to two shift register units, and two ends of the scanning line are coupled to the shift register units respectively. In this way, it is able to charge a gate line in a better manner, thereby to prevent the occurrence of an RC delay due to a too long gate line, e.g., for a large-size product.

Figure 2A:
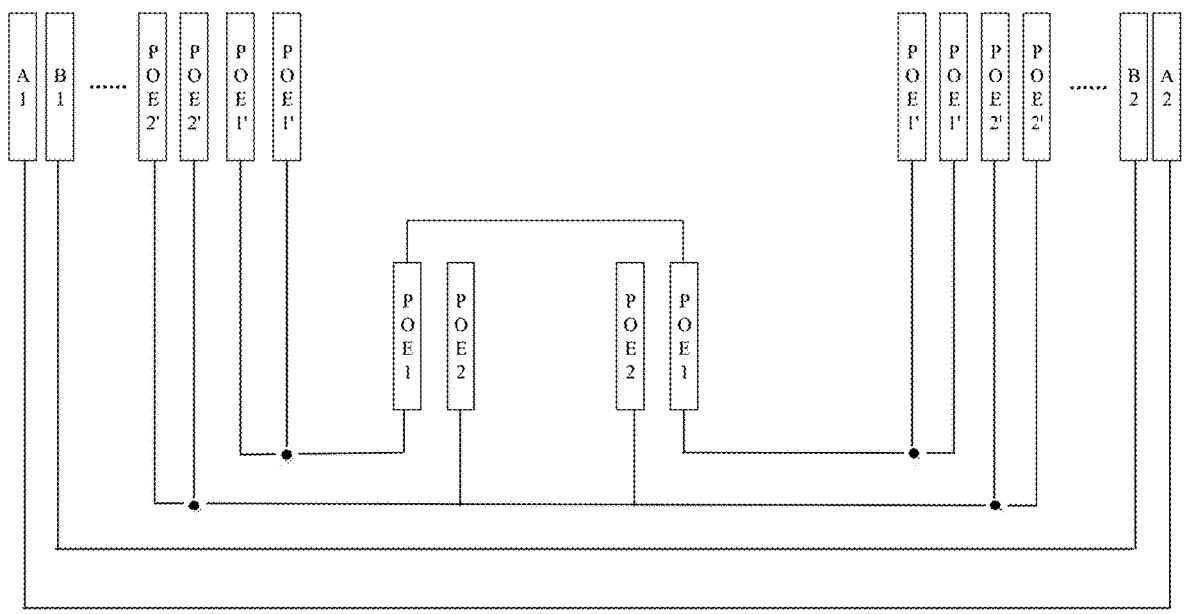
FIG. 2A is a schematic view showing a chip-on-film according to one embodiment of the present disclosure.
Figure 2B:
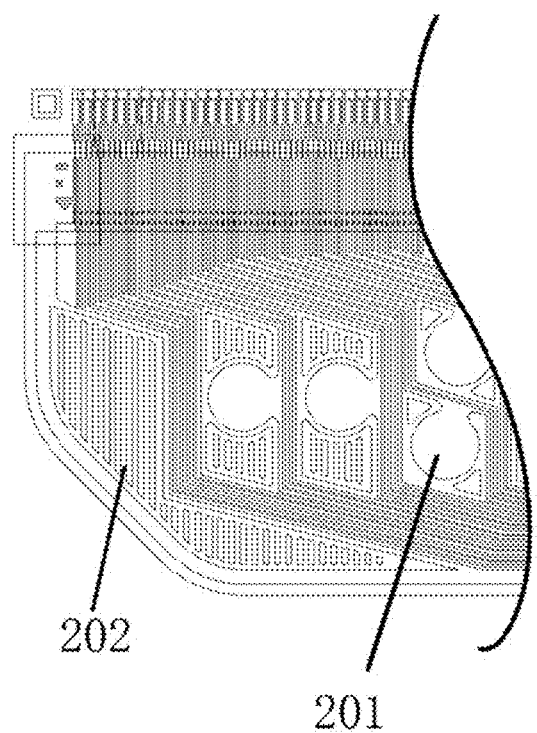
FIG. 2B is another schematic view showing the chip-on-film according to one embodiment of the present disclosure.

As shown in FIGS. 2A and 2B, POE1 and POE1' in FIG. 2A represent two ends of a first output control signal line OE1 in one COF respectively, and POE2 and POE2' represent two ends of a second output control signal line OE2 in one COF respectively. Each output control signal line includes two output connection ends connected in parallel to each other so as to obtain a same output control signal. For example, the first output control signal line OE1 includes two output connection ends POE1' connected in parallel to each other, and the second output control signal line OE2 includes two output connection ends POE2' connected in parallel to each other. In this way, it is able to improve the current transmission capability, meet the requirement on a width in a pin binding process, and improve the stability the binding of an Anisotropic Conductive Film (ACF).

In one COF, the two parallel output connection ends POE1' are coupled to another COF at a side adjacent to the COF, and the two parallel output connection ends POE2' are coupled to yet another COF at the other side adjacent to the COF. In some embodiments of the present disclosure, two output connection ends POE1' and two output connection ends POE2' of the adjacent COFs are connected through a gate connection driving line PLG.

As shown in FIG. 2B, a plurality of test patterns 201 and a plurality of dummy electrode patterns 202 are further arranged on the COF. The test pattern 201 is configured to test different signals, and the dummy electrode pattern 202 is mainly used to satisfy the requirement on the manufacture process and provide the COF with a uniform thickness.

Each first output control signal line OE1, after being extracted from the input connection end POE1, is coupled to the two output connection ends POE1' connected in parallel to each other. In some embodiments of the present disclosure, the input connection end POE1 refers to an end bound to a control chip, for example, a chip of the COF, and the output connection end POE1' refers to an end bound to the display panel.

Each second output control signal line OE2, after being extracted from the input connection end POE2, is coupled to the two output connection ends POE2' connected in parallel to each other. In some embodiments of the present disclosure, the input connection end POE2 refers to an end bound to a control chip, for example, the chip of the COF, and the output connection end POE2' refers to an end bound to the display panel.

In some embodiments of the present disclosure, the COF is bound to a fan-out region of the display panel through the ACF under the pressure of a pressing head. It should be appreciated that, the quantity and widths of the connection ends need to meet the requirement on the transmission of a current and the requirement on a process during the binding. Hence, in the embodiments of the present disclosure, each first output control signal line OE1 is further provided with two output connection ends connected in parallel to each other, so as to improve a conductive effect, thereby to improve the reliability of the display device.

As shown in FIGS. 1A and 1B, in some embodiments of the present disclosure, the output control signal lines include a first output control signal line OE1 and a second output control signal line OE2. The first output control signal line OE1 is coupled to a shift register unit corresponding to an odd-numbered scanning line, and the second output control signal line OE2 is coupled to a shift register unit corresponding to an even-numbered scanning line.

In the embodiments of the present disclosure, the description is given when the output control signal lines include the first output control signal line OE1 and the second output control signal line OE2. The shift register units corresponding to two adjacent scanning lines are coupled to the output control signal lines for providing different enable signals, that is to say, the shift register units coupled to a same output control signal line are arranged at intervals. When the scanning lines are sequentially numbered from one end to the other end along an arrangement direction thereof, the first output control signal line is coupled to the shift register unit corresponding to an odd-numbered scanning line, and the second output control signal line is coupled to the shift register unit corresponding to an even-numbered scanning line, so as to provide different enable signals for the shift register units corresponding to the two adjacent scanning lines.

Figure 3:
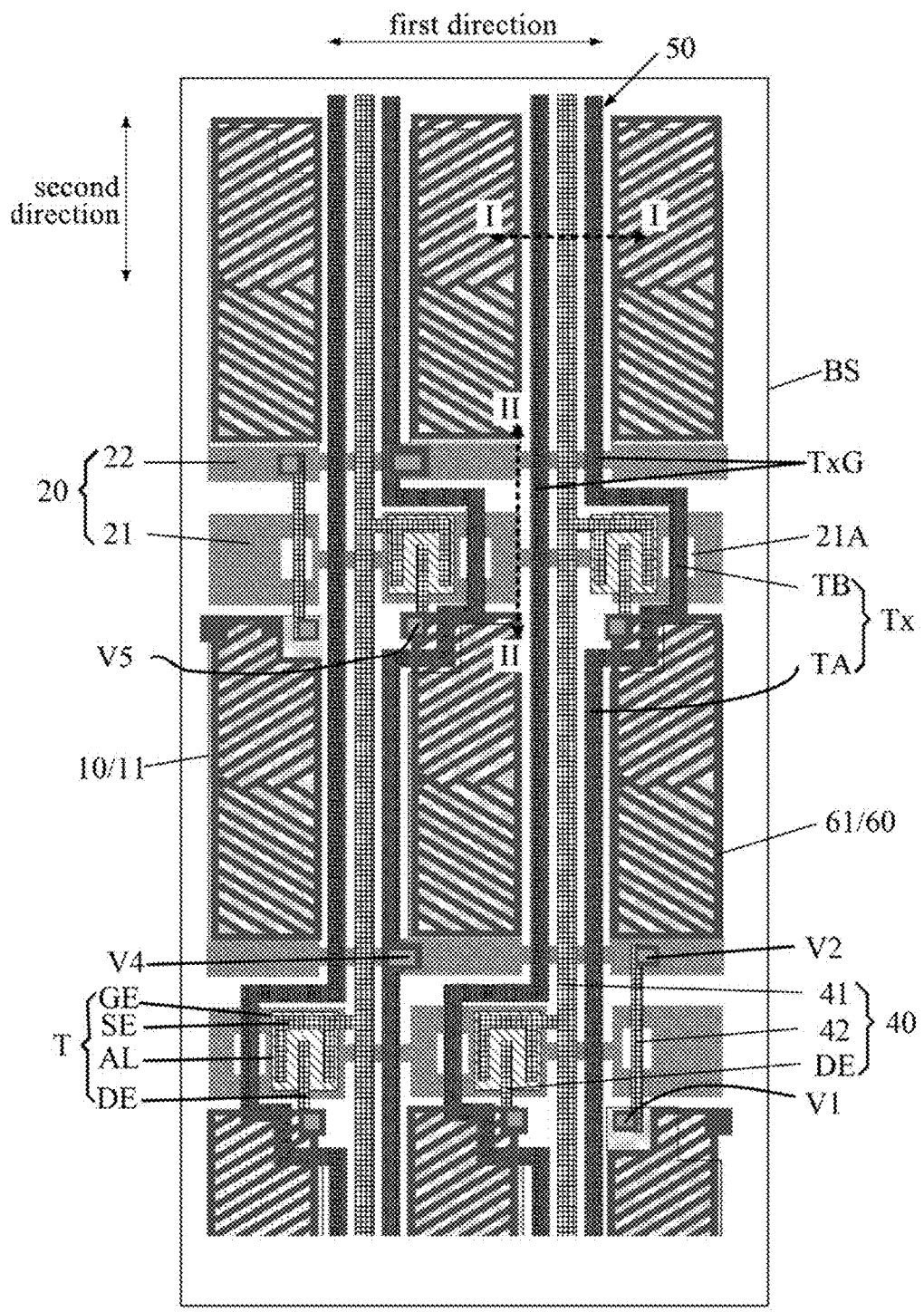
FIG. 3 is a schematic view showing the display substrate according to one embodiment of the present disclosure.

As shown in FIG. 3, in some embodiments of the present disclosure, the display substrate includes a base substrate BS, and a plurality of scanning lines 21 and a plurality of data signal lines 41 on the base substrate BS. The plurality of scanning lines 21 extends along a first direction and is sequentially arranged along a second direction different from the first direction. The plurality of data signal lines 41 extends along the second direction and is arranged sequentially along the first direction. An orthogonal projection of each data signal line 41 onto the base substrate BS crosses an orthogonal projection of each scanning line 21 onto the substrate BS. For example, the scanning line 21 has a first width at a position where the scanning line overlaps the data signal line 41, and it has a second width at a position between the adjacent data signal lines 41. The first width and the second width are sizes of the scanning line 21 in the second direction, and the first width is smaller than the second width. When the scanning line 21 has a relatively small width at the position where the scanning line overlaps the data signal line 21, it is able to reduce an overlapping area between the scanning line 21 and the data signal line 41, thereby to reduce a load of the display substrate.

The scanning lines 21 cross the data signal lines 41 to define a sub-pixel regions, and each sub-pixel region includes an opening region and a non-opening region surrounding the opening region. In a device including the display substrate, the non-opening region is a region shielded by a black matrix, and the opening region is a region not shielded by the black matrix. The scanning lines 21 and the data signal lines 41 are located in the non-opening regions. For example, in the embodiments of the present disclosure, the display substrate is used to achieve a display function. In this case, each sub-pixel region includes a display region (the opening region) and a non-display region surrounding the display region (the non-opening region), and the scanning lines 21 and the data signal lines 41 are located in the non-display regions. In addition, the display substrate may also be used to achieve any other functions, which will not be particularly defined herein. The following description will be given when the display substrate is used to achieve the display function.

In a possible embodiment of the present disclosure, the display substrate further include a plurality of touch signal lines Tx extending along an extension direction of the data signal line 41 (i.e., the second direction) and arranged sequentially along an extension direction of the scanning lines 21 (i.e., the first direction). The plurality of touch signal lines Tx is divided into a plurality of touch signal line groups TxG, and each touch signal line group TxG includes two adjacent touch signal lines Tx (namely, there is no other touch signal line Tx between the two adjacent touch signal lines Tx). As shown in FIG. 3, orthogonal projections of the two adjacent touch signal lines Tx onto the base substrate BS are located at two sides of an orthogonal projection of the same data signal line 41 onto the base substrate BS respectively (namely, the orthogonal projection of the data signal line 41 onto the base substrate is located between the orthogonal projections of the two adjacent touch signal lines Tx onto the base substrate). The touch signal line Tx is arranged at a layer different from the scanning lines 21 and the data signal lines 41. FIG. 3 merely shows two touch signal line groups TxG and two data signal lines. In some embodiments of the present disclosure, in order to ensure consistency in electric fields at two sides of each data signal line 41 of the display substrate, the orthogonal projection of the data signal line 41 onto the base substrate is located between the orthogonal projections of the two adjacent touch signal lines Tx in a same touch signal line group TxG.

On one hand, the orthogonal projection of the data signal line 41 onto the base substrate is located between the orthogonal projections of the two touch signal lines Tx adjacent to the data signal line 41 onto the base substrate, so it is able to reduce a difference in the electric fields generated at the two sides of the data signal line 41, thereby to prevent a display effect of the display device including the display substrate from being adversely affected by the touch signal line Tx. On the other hand, when a fault occurs for one of the data signal line 41 and the adjacent two touch signal lines Tx, as compared with a mode where the data signal line 41 is arranged at a same layer as the two adjacent touch signal lines Tx, through providing the data signal line 41 at a layer different from the two adjacent touch signal lines Tx, it is able to prevent the occurrence of short circuit, and facilitate the maintenance. Furthermore, when the data signal line is arranged at a layer different from the two adjacent touch signal lines Tx, it is able to provide a small distance between the orthogonal projection of each touch signal line Tx onto the base substrate and the orthogonal projection of the data signal line 41 onto the base substrate. In some embodiments of the present disclosure, the two adjacent touch signal lines Tx and the data signal line 41 are arranged at the non-opening region of the sub-pixel region, so as to improve an aperture ratio of the display substrate.

Figure 4:
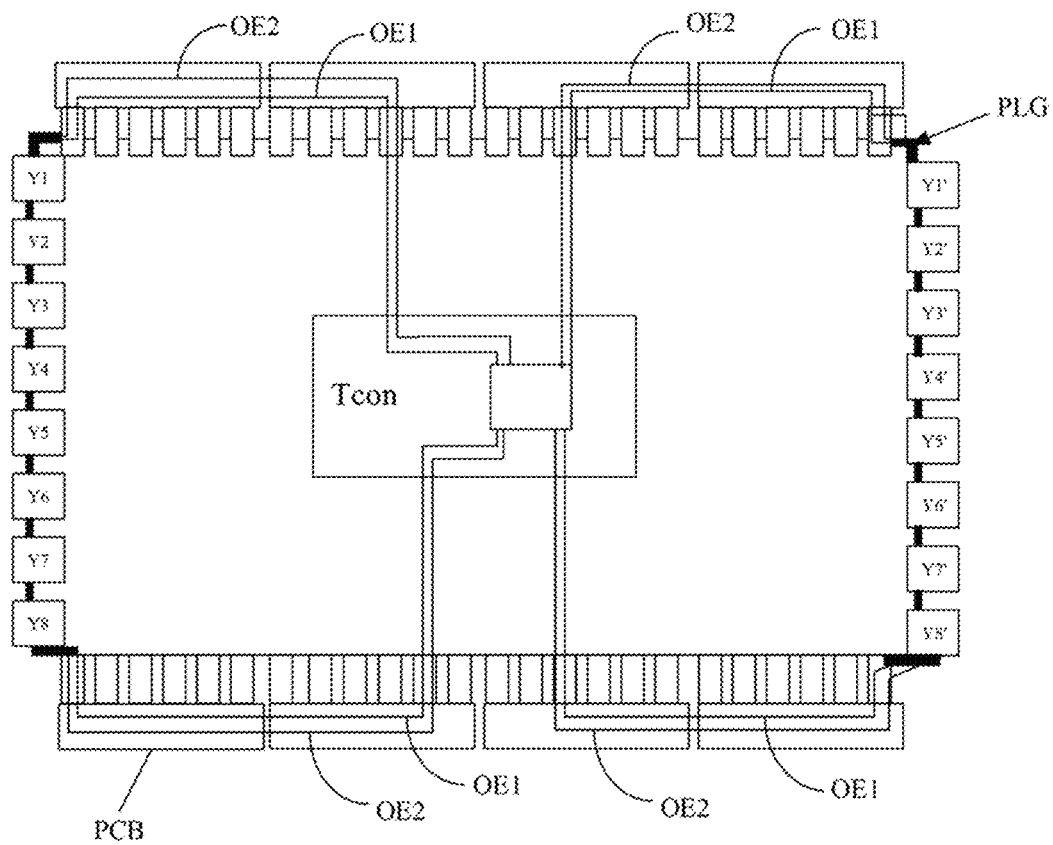
FIG. 4 is another schematic view showing the display substrate according to one embodiment of the present disclosure.

As shown in FIG. 4, in some embodiments of the present disclosure, at least two groups of output control signal lines are provided, and each group of output control signal lines include at least one first output control signal line OE1 and at least one second output control signal line OE2.

In some embodiments of the present disclosure, the shift register units corresponding to the scanning lines are arranged at both sides of the display substrate along the extension direction of the scanning lines, and each shift register unit is coupled to at least one group of output control signal lines.

As shown in FIG. 4, in some embodiments of the present disclosure, a plurality of chip-on-films Y1 to Y8 and Y1' to Y8' are provided, and the shift register units located at each side of the display substrate are only coupled to one group of output control signal lines. That is, for the plurality of chip-on-films Y1 to Y8, the shift register units are merely coupled to one of the two groups of output control signal lines on the left as shown in FIG. 4.

In some other embodiments of the present disclosure, the shift register units corresponding to the scanning lines are arranged at one side of the display substrate along the extension direction of the scanning line, and the two groups of output control signal lines are coupled to the shift register units at two ends along an arrangement direction of the scanning lines respectively.

As shown in FIG. 4, in some embodiments of the present disclosure, only the plurality of chip-on-films Y1 to Y8 are provided, and the plurality of chip-on-films Y1' to Y8' are not provided. The plurality of chip-on-films Y1 to Y8 are simultaneously coupled to the two groups of output control signal lines on the top and at the bottom as shown in FIG. 4.

Still referring to FIGS. 4, Y1 to Y8 each represent the chip-on-film coupled to one end of the scanning line, and Y1' to Y8' each represent the chip-on-film coupled to the other end of the scanning line corresponding to one of Y1 to Y8.

In the embodiments of the present disclosure, the above-mentioned schemes are combined, that is to say, the plurality of groups of control signal lines is provided, and each group of output control signal lines extracted from a controller, for example, a timing controller (Tcon), includes the first output control signal line OE1 and the second output control signal line OE2. In addition, the first output control signal line OE1 is coupled to the shift register units at two ends in the arrangement direction of the scanning line, and the second output control signal line OE2 is coupled to the shift register units at two ends in the extension direction of the scanning line, so as to provide the enable signals. In some embodiments of the present disclosure, Tcon includes a first signal control end for providing a signal to the first output control signal line OE1 and a second signal control end for providing a signal to the second output control signal line OE2. The first signal control end is coupled to the first output control signal lines OE1 in the plurality of groups of control signal lines, and the second signal control end is coupled to the second output control signal lines OE1 in the plurality of groups of control signal lines.

In the embodiments of the present disclosure, the shift register units are arranged at both sides of the extension direction of the scanning lines, as shown in FIG. 4. In other words, in the embodiments of the present disclosure, a plurality of chip-on-films Y1 to Y8 and Y1' to Y8' is provided, the plurality of chip-on-films Y1 to Y8 is coupled to the two groups of output control signal lines on the top and at the bottom as shown in FIG. 4, and the plurality of chip-on-films Y1' to Y8' is also coupled to the two groups of output control signal lines on the top and at the bottom.

In this way, through the plurality of groups of output control signal lines coupled to the shift register units at different positions, it is able to prevent the enable signals from being attenuated due to long-distance transmission, thereby to improve a control effect.

In some embodiments of the present disclosure, as shown in FIG. 4, the display substrate further includes a circuit board PCB for transmitting a data signal and a gate connection driving line (Periphery Line Glass, PLG), and along a direction from the circuit board to the shift register unit, the output control signal line passes through regions corresponding to the circuit board and the gate connection driving line sequentially.

In some embodiments of the present disclosure, the output control signal line is parallel to the PLG and extends along an extension direction of the PLG to achieve the connection between the chip-on-films. In the embodiments of the present disclosure, each bold line in FIG. 4 indicates the PLG between the chip-on-films.

In some embodiments of the present disclosure, the circuit board includes, but not limited to, a printed circuit board (XPCB).

The circuit board may be a single-piece circuit board, and when it is impossible for a size of the circuit board to meet the requirement of a large-size display substrate due to the limitation of a manufacturing process, a plurality of circuit sub-boards may also be spliced to form the circuit board for transmitting the data signal.

For example, the plurality of circuit sub-boards are sequentially arranged along a specific direction, e.g., along a length direction of the display panel, and coupled to each other through a flexible circuit board.

The present disclosure further provides in some embodiments a display device including the above-mentioned display substrate. In some embodiments of the present disclosure, the display device further includes a timing controller (Tcon), and the output control signal line is electrically coupled to a signal control end of Tcon to obtain the enable signal.

It should be appreciated that, Tcon is actually located at a back side of a display panel, but for ease of understanding, Tcon is arranged at a front surface of the display panel, i.e., a position of Tcon in the drawings shall not be construed as its actual position.

The display device includes the above-mentioned display substrate, so it may at least achieve the above-mentioned technical effects, which will not be particularly defined herein.

The present disclosure further provides in some embodiments a driving method for the above-mentioned display device, which includes: at a display stage, enabling at least one of a first enable signal and a second enable signal to be at a low level when a gate On signal is maintained at a high level, and enabling one of the first enable signal and the second enable signal to be at a high level and enabling the other one to be at a low level when the gate ON signal is at a low level; and at a touch stage t, maintaining the first enable signal and the second enable signal at a high level.

In the embodiments of the present disclosure, the touch detection is performed in an LHB manner, that is to say, one image is divided into a plurality of portions, and the touch detection is performed between two adjacent portions.

In the embodiments of the present disclosure, when the gate ON signal is maintained at a high level, both the first enable signal and the second enable signal are switched to, and maintained at, the high level, and at this time, the display panel is switched from a display mode to a touch mode.

In some embodiments of the present disclosure, the maintaining the first enable signal and the second enable signal at a high level at the touch stage includes, in the case that a gate ON signal corresponding to an $N^{th}$ scanning line is maintained at a high level, maintaining the first enable signal at a high level at a next rising edge of the first enable signal so as to control an output channel of the $N^{th}$ scanning line to be at a low level, and maintaining the second enable signal at a high level at a next rising edge of the second enable signal so as to control an output channel of an $(N-1)^{th}$ scanning line to be at a low level.

In the embodiments of the present disclosure, N is an integer greater than 1, the first enable signal and the second enable signal are provided by different output control signal lines, and the shift register units corresponding to the $N^{th}$ scanning line and the $(N-1)^{th}$ scanning line are two adjacent shift register units in the plurality of cascaded shift register units.

When the gate ON signal corresponding to the $N^{th}$ scanning line is maintained at a high level, the $N^{th}$ scanning line starts to output a channel signal XN, and a falling edge of the channel signal XN corresponds to the rising edge of the first enable signal. When the gate ON signal corresponding to an $(N-1)^{th}$ scanning line is maintained at a high level, the $(N-1)^{th}$ scanning line starts to output a channel signal XN−1, and a falling edge of the channel signal XN−1 corresponds to the rising edge of the second enable signal. From the falling edge of the channel signal XN, the gate ON signal, the first enable signal and the second enable signal are each at a high level at the same time. Then, the gate ON signal enters a falling edge before the second enable signal by one pulse width, the gate ON signal enters the falling edge before the first enable signal by three pulse widths, and the touch stage is between the rising edge of the first enable signal and the falling edge of the second enable signal.

In the embodiments of the present disclosure, the first enable signal refers to an enable signal provided by an output control signal line corresponding to the $N^{th}$ scanning line. The shift register units corresponding to the $N^{th}$, $(N-1)^{th}$ and $(N+1)^{th}$ scanning lines are cascaded and adjacent to each other, so the $(N-1)^{th}$ and $(N+1)^{th}$ scanning lines provide an enable signal, i.e., the second enable signal, different from the first enable signal via different output control signal lines.

Figure 5:
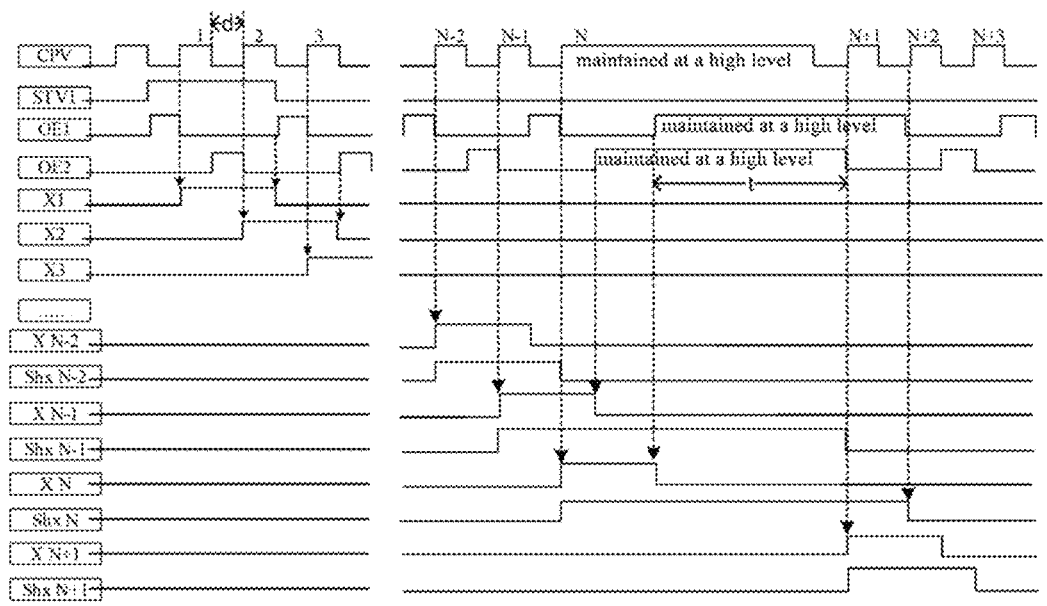
FIG. 5 is a sequence diagram of signals for a driving method according to one embodiment of the present disclosure.

As shown in FIG. 5, in a common display state, the gate ON signal (CPV) is a pulse signal for turning on each shift register unit. During the touch detection, the gate ON signal corresponding to the $N^{th}$ scanning line is maintained at a high level, and then, in the case that the first enable signal and the second enable signal are both maintained at a high level, the display device enters the touch stage t.

As shown in FIG. 5, a numerical value above the CPV signal represents a channel corresponding to the CPV pulse, STV1 represents an initial signal which is at a high level in an initial state and maintained at a low level subsequently, OE1 and OE2 are different enable signals, XN represents a channel signal outputted by an $N^{th}$ channel, and Shx N represents an internal shift data signal of the $N^{th}$ channel.

For example, the enable signal corresponding to the first channel is OE1, and a rising edge of the CPV signal corresponding to the first channel corresponds to the falling edge of OE1. At this time, the first channel outputs a channel signal X1, and at a next rising edge of OE1, the first channel stops the output of the channel signal X1. The enable signal corresponding to the second channel is OE2, and the rising edge of the CPV signal corresponding to the second channel corresponds to the falling edge of OE2. At this time, the second channel outputs a channel signal X2, and at a next rising edge of OE2 signal, the second channel stops the output of the channel signal X2, and so on.

In some embodiments of the present disclosure, the output channel of the $N^{th}$ scanning line is at a low level under the control of the first enable signal, and the output channel of the $(N-1)^{th}$ scanning line is at a low level under the control of the second enable signal.

It should be appreciated that, the enable signals for the scanning lines are triggered sequentially, so the second enable signal corresponding to the $(N-1)^{th}$ scanning line is triggered before the first enable signal for controlling the $N^{th}$ scanning line. In other words, chronologically, the output channel of the $(N-1)^{th}$ scanning line is at a low level under the control of the second enable signal, and then the output channel of the $N^{th}$ scanning line is at a low level under the control of the first enable signal.

In a possible embodiment of the present disclosure, as shown in FIG. 5, the CPV signal corresponding to the $N^{th}$ scanning line is maintained at a high level. The enable signal corresponding to the $N^{th}$ channel is OE1, and the enable signal corresponding to the $(N-1)^{th}$ channel is OE2. When the CPV signal corresponding to the $N^{th}$ scanning line is maintained at a high level, Shx N-1 is at a high level under the control of OE2.

In this way, through controlling the output channels of the $(N-1)^{th}$ and $N^{th}$ scanning lines to be at a low level, it is able to perform the scanning normally.

In some embodiments of the present disclosure, the second enable signal is maintained at a high level at a next rising edge of the second enable signal. In this way, within a time period where the gate ON signal is maintained at a high level, after the first enable signal and the second enable signal have been switched to a high level, they are maintained at a high level, so that the display panel enters a touch mode. After one of the first enable signal and the second enable signal is switched to a low level, the display panel enters a display mode.

In some embodiments of the present disclosure, a duration within which the first enable signal is maintained at a high level is equal to a duration within which the gate ON signal is maintained at a high level, and a duration within which the second enable signal is maintained at a high level is equal to the duration within which the gate ON signal is maintained at a high level, and the duration is greater than three pulse widths.

It should be appreciated that, within the duration where the gate ON signal is maintained at a high level, after the first enable signal and the second enable signal have switched to a high level, they are maintained at the high level. In other words, within a time period after the first enable signal has been switched to a high level, specifically before the second enable signal has been switched to a low level, the first enable signal and the second enable signal are maintained at a high level at the same time. In this way, the levels of the first enable signal and the second enable signal are not switched, and the channel signals of the output channels corresponding to the $(N-1)^{th}$ and $N^{th}$ scanning lines are not changed, so as to ensure the accuracy of the output signal.

In some embodiments of the present disclosure, a rising edge where the gate ON signal corresponding to the $N^{th}$ scanning line is maintained at a high level corresponds to a previous falling edge of the first enable signal, and a falling edge where the first enable signal is maintained at a high level corresponds to a rising edge of the gate ON signal of the $(N+2)^{th}$ scanning line.

In some embodiments of the present disclosure, a pulse width d is defined as from the falling edge of the gate ON signal to a rising edge of a next pulse signal.

As shown in FIG. 5, in the case of two enable signals, i.e., the first enable signal OE1 and the second enable signal OE2, a width between two pulse signals in the first enable signal OE1 and the second enable signal OE2 is three times the pulse width.

In this way, the rising edge where the gate ON signal corresponding to the $N^{th}$ scanning line is maintained at a high level is actually the falling edge of the first enable signal corresponding to the $(N-2)^{th}$ scanning line, and the rising edge of the first enable signal corresponding to the Nth scanning line is located after the rising edge of the gate ON signal corresponding to the $N^{th}$ scanning line by three pulse widths. The first enable signal is maintained at a high level, and a duration of the first enable signal is equal to a duration within which the gate ON signal corresponding to the $N^{th}$ scanning line is maintained at a high level. Hence, the falling edge of the first enable signal corresponding to the $N^{th}$ scanning line corresponds to the rising edge of the gate ON signal corresponding to the $(N+2)^{th}$ scanning line.

In some embodiments of the present disclosure, the falling edge where the second enable signal is maintained at a high level corresponds to the rising edge of the gate ON signal for the $(N+1)^{th}$ scanning line.

As shown in FIG. 5, the rising edge of the second enable signal corresponding to the $(N-1)^{th}$ scanning line is located after the rising edge of the gate ON signal corresponding to the $N^{th}$ scanning line by one pulse width, and the falling edge of the second enable signal corresponding to the $(N-1)^{th}$ scanning line corresponds to the rising edge of the gate ON signal corresponding to the $(N+1)^{th}$ scanning line.

Figure 6:
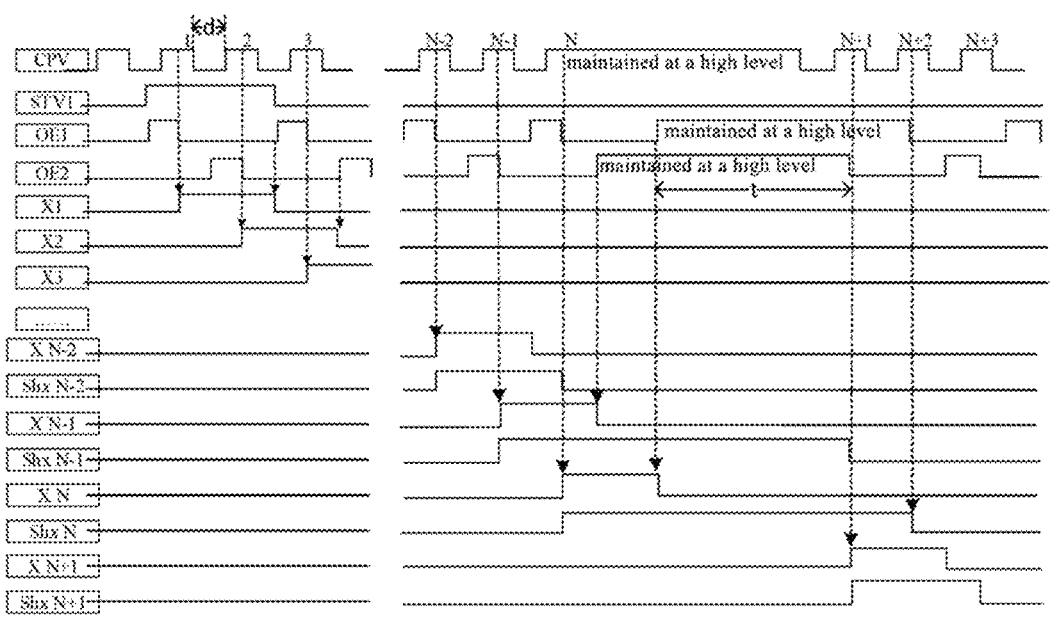
FIG. 6 is another sequence diagram of the signals for the driving method according to one embodiment of the present disclosure.

FIG. 6 shows another sequence diagram for the driving method. The rising edge where the gate ON signal corresponding to the $N^{th}$ scanning line is maintained at a high level corresponds to a previous high level of the first enable signal, the falling edge where the first enable signal is maintained at a high level corresponds to a high level of the gate ON signal for the $(N+2)^{th}$ scanning line, and the falling edge where the second enable signal is maintained at a high level corresponds to a high level of the gate ON signal for the $(N+1)^{th}$ scanning line. As compared with the driving method in FIG. 5, it is easier to track the high level of the gate ON signal than the rising edge or the falling edge, because a time length of the rising edge or the falling edge is short.

In the related art, each of the adjacent and cascaded shift register units is controlled by two secondary signals of a same enable signal, so it is impossible for the two secondary signals to be maintained at a high level simultaneously.

According to the embodiments of the present disclosure, the first enable signal and the second enable signal are different enable signals provided by different control output signal lines, so within a certain time period, the first enable signal and the second enable signal are maintained at a high level, so it is able to accurately control the output signal of the output channel. In addition, the data of the shift register units does not change, and when the display panel is switched from the touch mode to the display mode, the data is maintained normally for continuously performing the scanning, so it is able to improve the display effect, and prevent the occurrence of any display defects such as bright lines during the switching between the display mode and the touch mode.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a plurality of scanning lines and a plurality of shift register units coupled to the scanning lines and cascaded to each other, wherein the display substrate further comprises output control signal lines electrically coupled to the shift register units for providing enable signals for the shift register units, the output control signal lines comprise at least two output control signal lines for providing different enable signals, and two adjacent and cascaded shift register units are coupled to different output control signal lines, wherein the display substrate further includes a base substrate; a plurality of data signal lines on the base substrate, an orthogonal projection of each data signal line onto the base substrate crossing an orthogonal projection of each scanning line onto the base substrate; a plurality of touch sensing blocks arranged on the base substrate and spaced apart from each other, each touch sensing block comprising a plurality of touch electrodes electrically coupled to each other and spaced apart from each other; and a plurality of touch signal lines arranged on the base substrate, at least a part of the touch signal lines being electrically coupled to the plurality of touch sensing blocks respectively, wherein the plurality of touch signal lines extends along an extension direction of the plurality of data signal lines, the plurality of touch signal lines is divided into a plurality of touch signal line groups, each touch signal line group comprises adjacent touch signal lines, orthogonal projections of the touch signal lines in a same touch signal line group onto the base substrate are located at two sides of an orthogonal projection of a same data signal line onto the base substrate, the orthogonal projections of the adjacent touch signal lines and the orthogonal projection of the same data signal line each comprises a portion located between orthogonal projections of the adjacent touch electrodes onto the base substrate, and a layer where the adjacent touch signal lines are located is different from a layer where the data signal line is located.

2. The display substrate according to claim 1, wherein at least two output control signal lines are electrically coupled to different signal control ends, and the enable signals provided by the at least two output control signal lines are at a high level at some time points.

3. The display substrate according to claim 1, wherein the output control signal lines comprise a first output control signal line and a second output control signal line, the first output control signal line is coupled to the shift register units corresponding to odd-numbered scanning lines, and the second output control signal line is coupled to the shift register units corresponding to even-numbered scanning lines.

4. The display substrate according to claim 1, wherein the output control signal lines are divided into at least two groups, each group of output control signal lines comprise at least one first output control signal line and at least one second output control signal line, the shift register units corresponding to the scanning lines are arranged at both sides of the display substrate along an extension direction of the scanning lines, and each shift register unit is coupled to at least one group of output control signal lines.

5. The display substrate according to claim 1, wherein the output control signal lines are divided into at least two groups, each group of output control signal lines comprise at least one first output control signal line and at least one second output control signal line, the shift register units corresponding to the scanning lines are arranged at one side of the display substrate along an extension direction of the scanning line, and the two groups of output control signal lines are coupled to the shift register unit at two ends along a direction in which the scanning lines are arranged, respectively.

6. The display substrate according to claim 1, further comprising a circuit board for transmitting a data signal and a gate connection driving line, wherein the output control signal line passes through regions corresponding to the circuit board and the gate connection driving line sequentially along a direction from the circuit board to the shift register unit.

7. The display substrate according to claim 1, wherein each touch signal line comprises a plurality of body portions and a plurality of curved portions, the body portions and the curved portions are arranged alternately, an orthogonal projection of each body portion onto the base substrate is located between the orthogonal projections of the adjacent touch electrodes onto the base substrate, the display substrate further comprises a plurality of switching elements on the base substrate, and each switching element is located between one curved portion and the data signal line.

8. A display device, comprising the display substrate according to claim 1.

9. The display device according to claim 8, further comprising a timing controller, wherein the output control signal line is electrically coupled to a signal control end of the timing controller to obtain the enable signal.

10. A driving method for a display device including a display substrate, wherein the display substrate includes a plurality of scanning lines and a plurality of shift register units coupled to the scanning lines and cascaded to each other, wherein the display substrate further comprises output control signal lines electrically coupled to the shift register units for providing enable signals for the shift register units, the output control signal lines comprise at least two output control signal lines for providing different enable signals, and two adjacent and cascaded shift register units are coupled to different output control signal lines, the driving method comprises:
enabling at least one of a first enable signal and a second enable signal to be at a low level at a display stage; and
maintaining the first enable signal and the second enable signal at a high level at a touch stage.

11. The driving method according to claim 10, wherein the maintaining the first enable signal and the second enable signal at a high level at the touch stage comprises, in the case that a gate ON signal corresponding to an $N^{th}$ scanning line is maintained at a high level, maintaining the first enable signal at a high level at a next rising edge of the first enable signal so as to control an output channel of the $N^{th}$ scanning line to be at a low level, and maintaining the second enable signal at a high level at a next rising edge of the second enable signal so as to control an output channel of an $(N-1)^{th}$ scanning line to be at a low level, wherein when the first enable signal and the second enable signal are maintained at a high level, the display device enters the touch stage, N is an integer greater than 1, the first enable signal and the second enable signal are enable signals provided by different output control signal lines, and shift register units corresponding to the $N^{th}$ scanning line and the $(N-1)^{th}$ scanning line are two adjacent shift register units in a plurality of shift register units cascaded to each other.

12. The driving method according to claim 11, wherein a rising edge where the gate ON signal corresponding to the $N^{th}$ scanning line is maintained at a high level corresponds to a previous high level of the first enable signal, a falling edge where the first enable signal is maintained at a high level corresponds to a high level of the gate ON signal corresponding to an $(N+2)^{th}$ scanning line, and a falling edge where the second enable signal is maintained at a high level corresponds to a high level of the gate ON signal corresponding to the $(N+1)^{th}$ scanning line.

13. The driving method according to claim 11, wherein a duration within which the first enable signal and the second enable signal are maintained at a high level is the same as a duration within which the gate ON signal is maintained at a high level.

14. The driving method according to claim 11, wherein a rising edge where the gate ON signal corresponding to the $N^{th}$ scanning line is maintained at a high level corresponds to a previous falling edge of the first enable signal, a falling edge where the first enable signal is maintained at a high level corresponds to a rising edge of the gate ON signal corresponding to the $(N+2)^{th}$ scanning line, and a falling edge where the second enable signal is maintained at a high level corresponds to a rising edge of the gate ON signal corresponding to the $(N+1)^{th}$ scanning line.

\* \* \* \* \*